(12) United States Patent
Chen et al.

(10) Patent No.: US 12,294,037 B2
(45) Date of Patent: May 6, 2025

(54) LIGHT-EMITTING DIODE CHIP AND METHOD FOR MANUFACTURING THE SAME

(71) Applicant: XIAMEN SANAN OPTOELECTRONICS TECHNOLOGY CO., LTD., Xiamen (CN)

(72) Inventors: Gong Chen, Xiamen (CN); Su-Hui Lin, Xiamen (CN); Sheng-Hsien Hsu, Xiamen (CN); Kang-Wei Peng, Xiamen (CN); Ling-Yuan Hong, Xiamen (CN); Minyou He, Xiamen (CN); Chia-Hung Chang, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 586 days.

(21) Appl. No.: 17/450,630

(22) Filed: Oct. 12, 2021

(65) Prior Publication Data
US 2022/0029052 A1 Jan. 27, 2022

Related U.S. Application Data

(63) Continuation-in-part of application No. PCT/CN2019/082766, filed on Apr. 15, 2019.

(51) Int. Cl.
*H01L 33/00* (2010.01)
*H01L 33/24* (2010.01)

(52) U.S. Cl.
CPC .......... *H01L 33/0095* (2013.01); *H01L 33/24* (2013.01)

(58) Field of Classification Search
None
See application file for complete search history.

(56) References Cited

U.S. PATENT DOCUMENTS

2006/0258047 A1   11/2006   Nishiwaki et al.
2009/0085231 A1*   4/2009   Chiu .................. H01L 21/56
                                              257/E23.116

FOREIGN PATENT DOCUMENTS

CN   101083292 A   12/2007
CN   103515489 A    1/2014

OTHER PUBLICATIONS

Search Report issued to PCT Application No. PCT/CN2019/082766 on Jan. 14, 2020.

\* cited by examiner

*Primary Examiner* — Alexander G Ghyka
(74) *Attorney, Agent, or Firm* — Muncy, Geissler, Olds & Lowe, P.C.

(57) ABSTRACT

A light-emitting diode chip includes a substrate. The substrate has a side surface configured as a serrated surface, which includes a plurality of laser inscribed features disposed along a thickness direction of the substrate and spaced apart from each other. A method for manufacturing the light-emitting diode chip is also disclosed herein.

5 Claims, 9 Drawing Sheets

US 12,294,037 B2

LIGHT-EMITTING DIODE CHIP AND METHOD FOR MANUFACTURING THE SAME

CROSS-REFERENCE TO RELATED APPLICATION

This application is a bypass continuation-in-part application of PCT International Application No. PCT/CN2019/082766 filed on Apr. 15, 2019. The entire content of the international patent application is incorporated herein by reference.

FIELD

The disclosure relates to a light-emitting diode chip and a manufacturing method thereof, and more particularly to a light-emitting diode chip and a manufacturing method thereof by stealth dicing.

BACKGROUND

Currently, a prepared wafer for light-emitting diode (LED) is usually cut into individual LED chips by stealth dicing to form a singular inscribed mark in an interior of the wafer, followed by splitting the wafer along such inscribed mark. However, when a wafer having a great thickness (e.g., a thickness of greater than 150 μm) is to be cut into individual LED chips by forming the singular inscribed mark, the following shortcomings might occur:

(1) the wafer may not be split completely due to a smaller laser energy used for stealth dicing, resulting in a poor yield of the LED chips; and (2) as shown in FIGS. 1(a) and 1(b), even if the wafer 9 can be split normally, it may have a serious oblique fracture since a position of the inscribed mark (not shown) is largely deviated from a splitting position 9a. The light-emitting areas of the wafer might be easily damaged by the oblique fracture, thereby decreasing luminous brightness of the LED chips thus formed. In such case, a width of a dicing street of the wafer should be increased for reducing the damage of the light-emitting areas, which might cause a low production yield of the LED chips formed from the wafer.

In order to overcome the abovementioned shortcomings, i.e., the low production yield and the low luminous brightness of the LED chips caused by the oblique fracture, a stealth dicing might be performed from a backside of a wafer at a dicing depth from a back surface of the wafer which is greater than a half of the thickness of the wafer. However, a position of a laser beam for the stealth dicing, which might be proximate to a semiconductor light-emitting stack of the wafer, might increase an electrical failure rate of the LED chips thus formed. In such case, the stealth dicing should be performed with a smaller laser energy to reduce the electrical failure rate of the LED chips. However, in the subsequent splitting process, the wafer might not be split completely, resulting in a poor splitting yield.

In general, in order to ensure a good optoelectrical property and a high yield of the LED chips split from a wafer, a stealth dicing for forming the LED chips is performed with a proper laser energy and at a proper laser focal position. As such, the laser inscribed marks formed by the stealth dicing in an interior of the wafer might be kept within a certain range, and a side surface of the LED chip obtained by splitting the wafer might be smooth, which is not conducive for light emitting out of the side surface of the LED chip.

SUMMARY

An object of the disclosure is to provide a light-emitting diode chip and a manufacturing method thereof which can alleviate or overcome the aforesaid shortcomings of the prior art.

According to a first aspect of the disclosure, a light-emitting diode chip includes a substrate. The substrate has a side surface configured as a serrated surface, which includes a plurality of laser inscribed features disposed along a thickness direction of the substrate and spaced apart from each other.

According to a second aspect of the disclosure, a method for manufacturing a light-emitting diode chip includes a step of forming a plurality of laser inscribed features by stealth dicing in a portion of a substrate of a light-emitting structure corresponding to a dicing street of the light-emitting structure. The laser inscribed features are spaced apart from each other in a thickness direction of the substrate.

BRIEF DESCRIPTION OF THE DRAWINGS

Other features and advantages of the disclosure will become apparent in the following detailed description of the embodiment(s) with reference to the accompanying drawings, in which.

Figure 8:
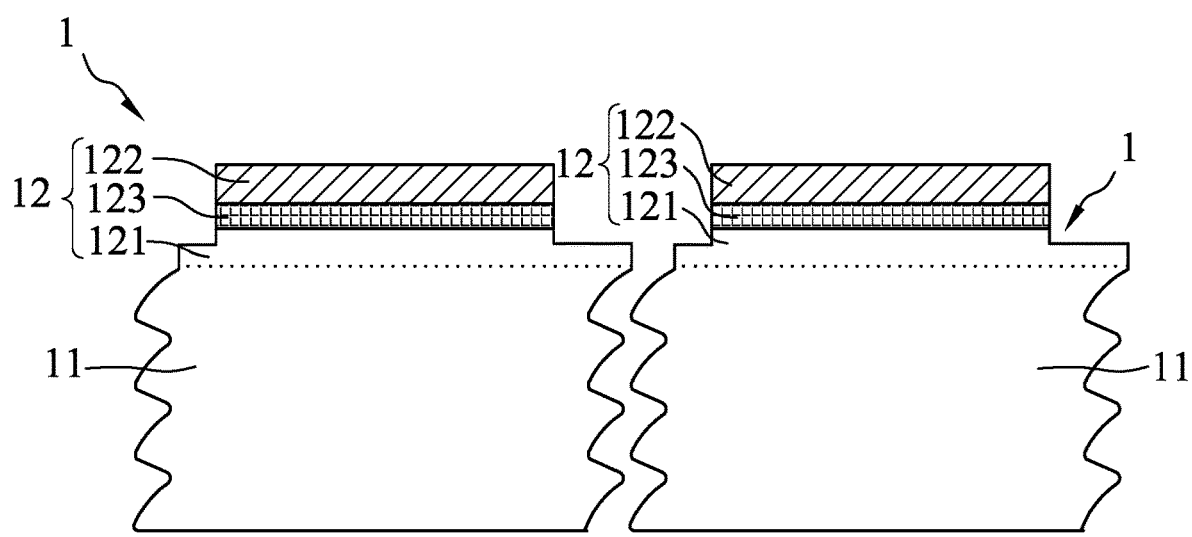
Figure 9:
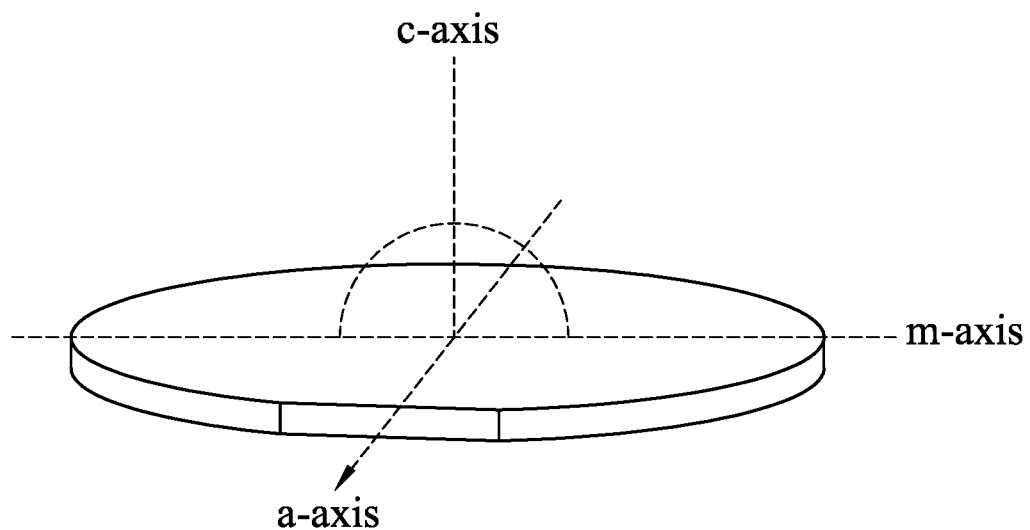
Figure 10:
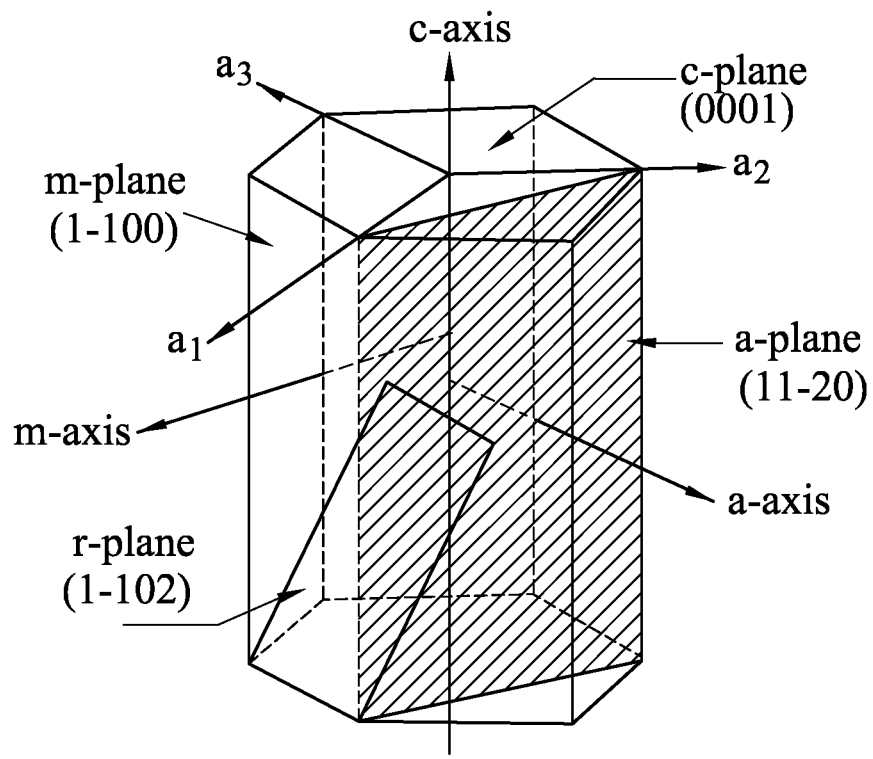
Figure 11:
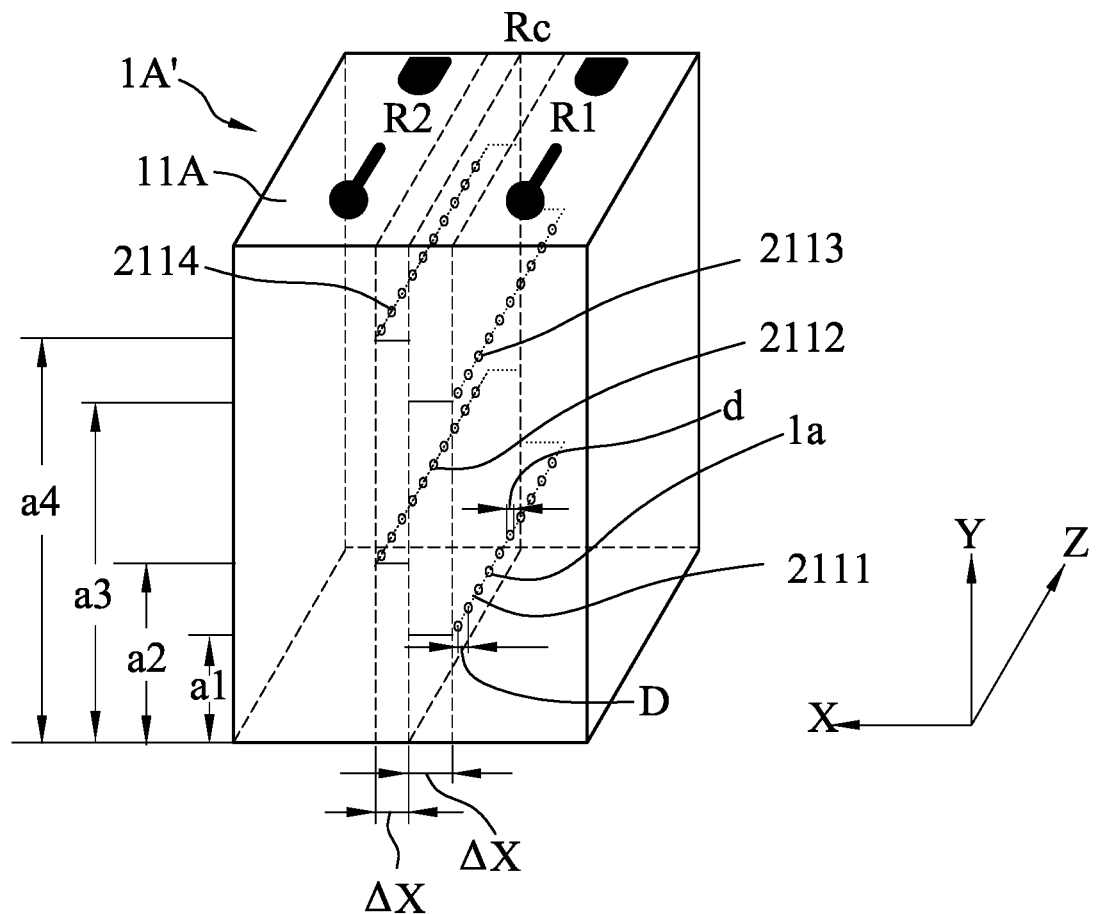
Figure 12:
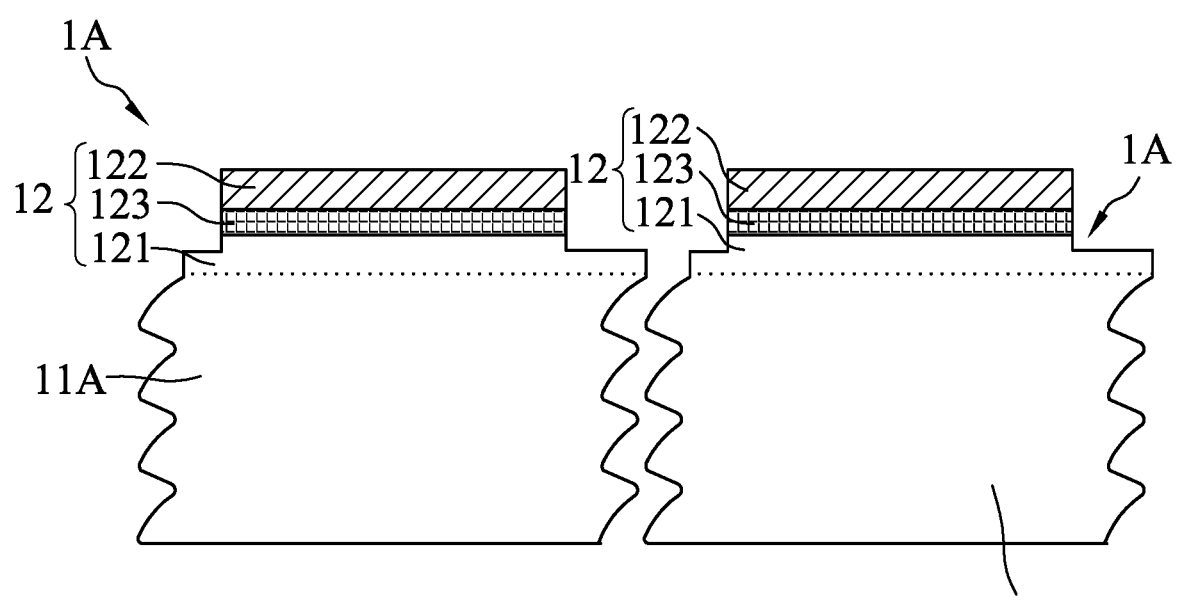
Figure 13:
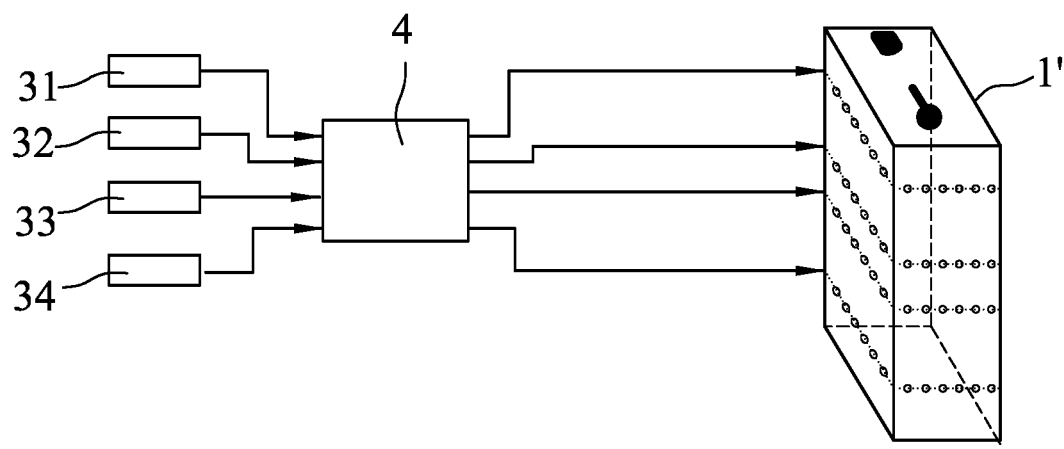
Figure 14:
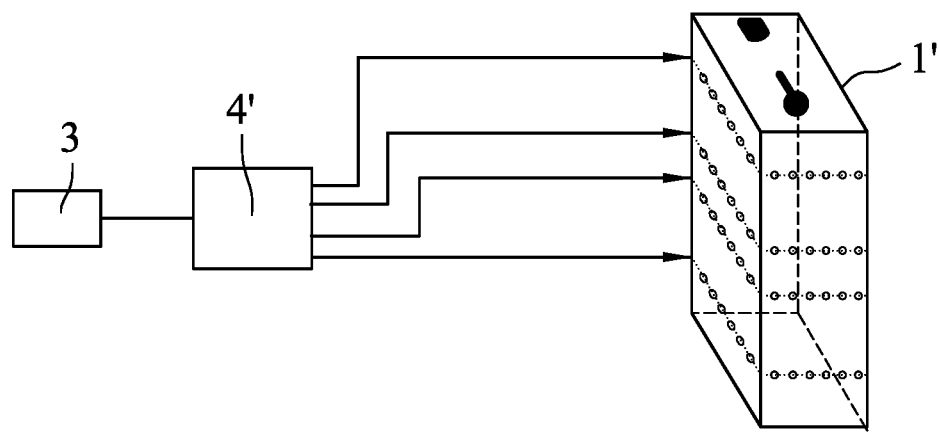

7b is a schematic perspective view illustrating steps S11 to S19 of a variation of the embodiment of the method for manufacturing the first embodiment of the light-emitting diode chip;

FIG. 8 is a schematic view illustrating step S20 of the embodiment of the method for manufacturing the first embodiment of the light-emitting diode chip;

FIG. 9 is a schematic perspective view illustrating a substrate of the first embodiment according to the disclosure;

FIG. 10 is a schematic perspective view illustrating a unit cell of the substrate;

FIG. 11 is a schematic view illustrating steps S11 to S14 of the embodiment of a method for manufacturing the second embodiment of the light-emitting diode chip;

FIG. 12 is a schematic view illustrating step S20 of the embodiment of the method for manufacturing the second embodiment of the light-emitting diode chip;

FIG. 13 is a schematic view illustrating steps S11 to S14 of a variant of the embodiment of the method for manufacturing the first embodiment of the light-emitting diode chip; and FIG. 14 is a schematic view illustrating steps S11 to S14 of another variant of the embodiment of the method for manufacturing the first embodiment of the light-emitting diode chip.

DETAILED DESCRIPTION

Before the disclosure is described in greater detail, it should be noted that where considered appropriate, reference numerals have been repeated among the figures to indicate corresponding or analogous elements, which may optionally have similar characteristics.

It should be noted that, directional terms, such as "rightward," "leftward," "vertical," "horizontal," "top," "bottom," "upper," "lower," "front," "rear," "left," and "right" may be used to assist in describing the disclosure based on the orientation of the embodiments shown in the figures. The use of these directional definitions should not be interpreted to limit the disclosure in any way.

Figure 1A:
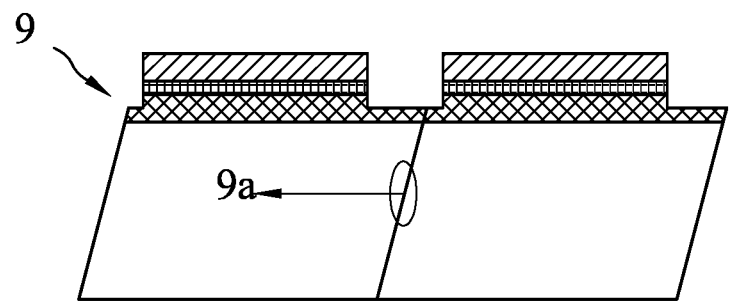
FIGS. 1a and 1b are respectively schematic side and top views illustrating an oblique fracture of a conventional light-emitting diode structure to be cut into LED chips.
Figure 1B:
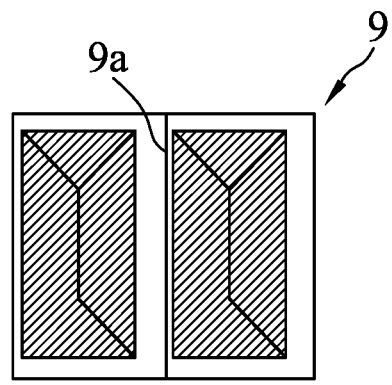
Figure 2:
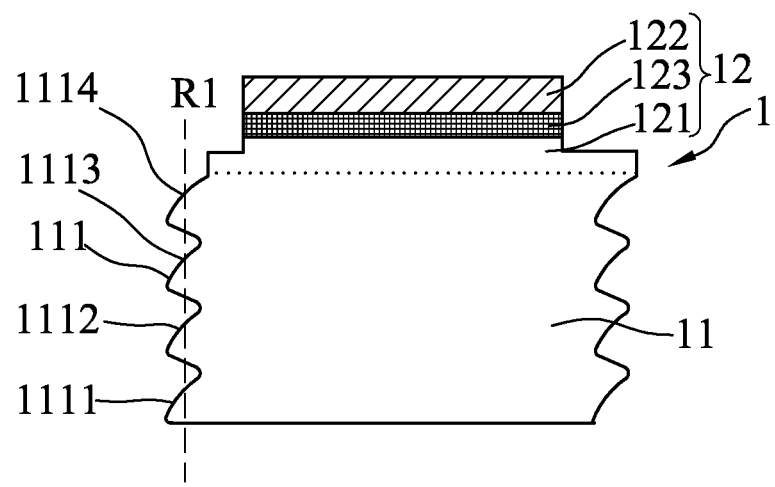
FIG. 2 is a schematic view of a first embodiment of a light-emitting diode chip according to the disclosure.

Referring to FIG. 2, a first embodiment of a light-emitting diode chip 1 according to the present disclosure includes a substrate 11 and a semiconductor light-emitting stack 12 disposed on the substrate (11). The substrate 11 may be a sapphire substrate, and may have a c-plane (not shown) which is used to form the semiconductor light-emitting stack 12 thereon. The substrate 11 has a side surface 111 configured as a serrated surface, which includes a plurality of laser inscribed features disposed along a thickness direction of the substrate 11 and spaced apart from each other. In this embodiment, the side surface 111 has four laser inscribed features 1111, 1112, 1113, 1114. In alternative embodiments, a number of the laser inscribed features may vary depending on the thickness of the substrate 11, and may be 3, 5, or more. Specifically, if the thickness of the substrate 11 is small, the number of the laser inscribed features may be small, such as 3. On the other hand, if the thickness of the substrate 11 is large, the number of the laser inscribed features may be large, such as 5, or more. In some embodiments, a distance between the laser inscribed feature (e.g., the laser inscribed feature 1114) and the semiconductor light-emitting stack 12 may range from two-third to one-fifth of the thickness of the light-emitting diode chip 1, in which the laser inscribed feature is proximate to the semiconductor light-emitting stack 12. It is noted that if the laser inscribed feature is formed by stealth dicing at a position too close to the semiconductor light-emitting stack 12, the semiconductor light-emitting stack 12 might be damaged.

The substrate 11 defines a reference plane R1 in the thickness direction, and the laser inscribed features 1111, 1112, 1113, 1114 are located in the reference plane R1 (i.e., a vertical reference plane). Such a processing is relatively easy.

The semiconductor light-emitting stack 12 is disposed on the c-plane of the substrate 11, and includes a first conductivity type semiconductor layer 121, a second conductivity type semiconductor layer 122 and a light-emitting layer 123. The first conductivity type semiconductor layer 121 is disposed on the c-plane of the substrate 11, the light-emitting layer 123 is disposed on the first conductivity type semiconductor layer 121 opposite to the substrate 11, and the second conductivity type semiconductor layer 122 is disposed on the light-emitting layer 123 opposite to the first conductivity type semiconductor layer 121. In some embodiments, one of the first conductivity type semiconductor layer 121 and the second conductivity type semiconductor layer 122 is an N-type semiconductor layer, and the other of the first conductivity type semiconductor layer 121 and the second conductivity type semiconductor layer 122 is a P-type semiconductor layer. In this embodiment, the first conductivity type semiconductor layer 121 is made of N-type gallium nitride, the second conductivity type semiconductor layer 122 is made of P-type gallium nitride, and the light-emitting layer 123 is formed as a multi-quantum well (MQW) structure.

Figure 3:
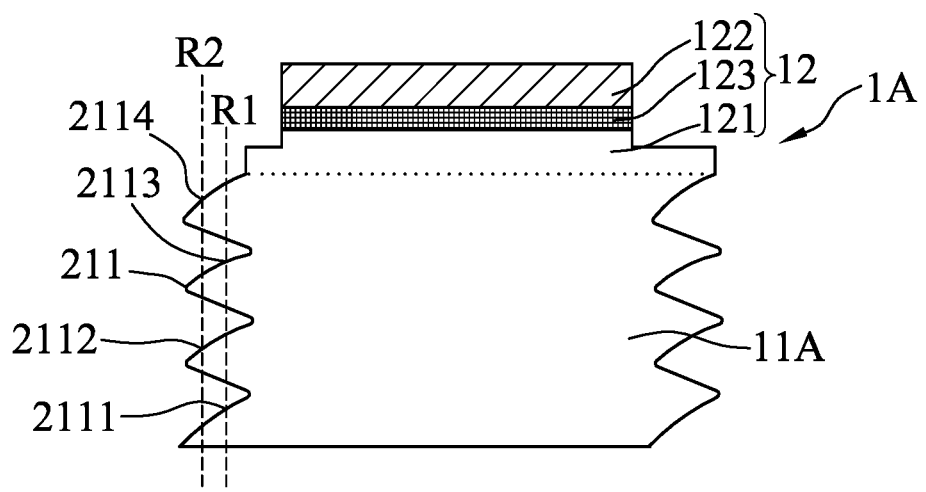
FIG. 3 is a schematic view of a second embodiment of the light-emitting diode chip according to the disclosure.

Referring to FIG. 3, a second embodiment of a light-emitting diode chip 1A according to the present disclosure is generally similar to the first embodiment of the light-emitting diode chip 1, except for the following differences.

Specifically, the substrate 11A defines a plurality of reference planes R1, R2 in the thickness direction. The reference planes R1, R2 are parallel to each other, and the laser inscribed features 2111, 2112, 2113, 2114 are located in the reference planes R1, R2. In this embodiment, the substrate 11A defines two reference planes R1, R2 in the thickness direction. The two reference planes R1, R2 are parallel to each other. The laser inscribed features 2111, 2113 are categorized into a first group of the laser inscribed features 2111, 2112, 2113, 2114, and the laser inscribed features 2112, 2114 are categorized into a second group of the laser inscribed features 2111, 2112, 2113, 2114. The first group and the second group are located in the two reference planes R1, R2, respectively. The laser inscribed features 2111, 2113 in the first group are staggered with the laser inscribed features 2112, 2114 in the second group. As such, a side surface 211 of the light-emitting diode chip 1A is configured as a more serrated shape, thereby further increasing an amount of light emitted from the side surface 211 and enhancing luminous efficiency of the light-emitting diode chip 1A.

Referring to FIGS. 4 to 8, an embodiment of a method 100 for manufacturing the first embodiment of the light-emitting diode chip 1 according to the disclosure includes the following consecutive steps S10 to S20.

Figure 4:
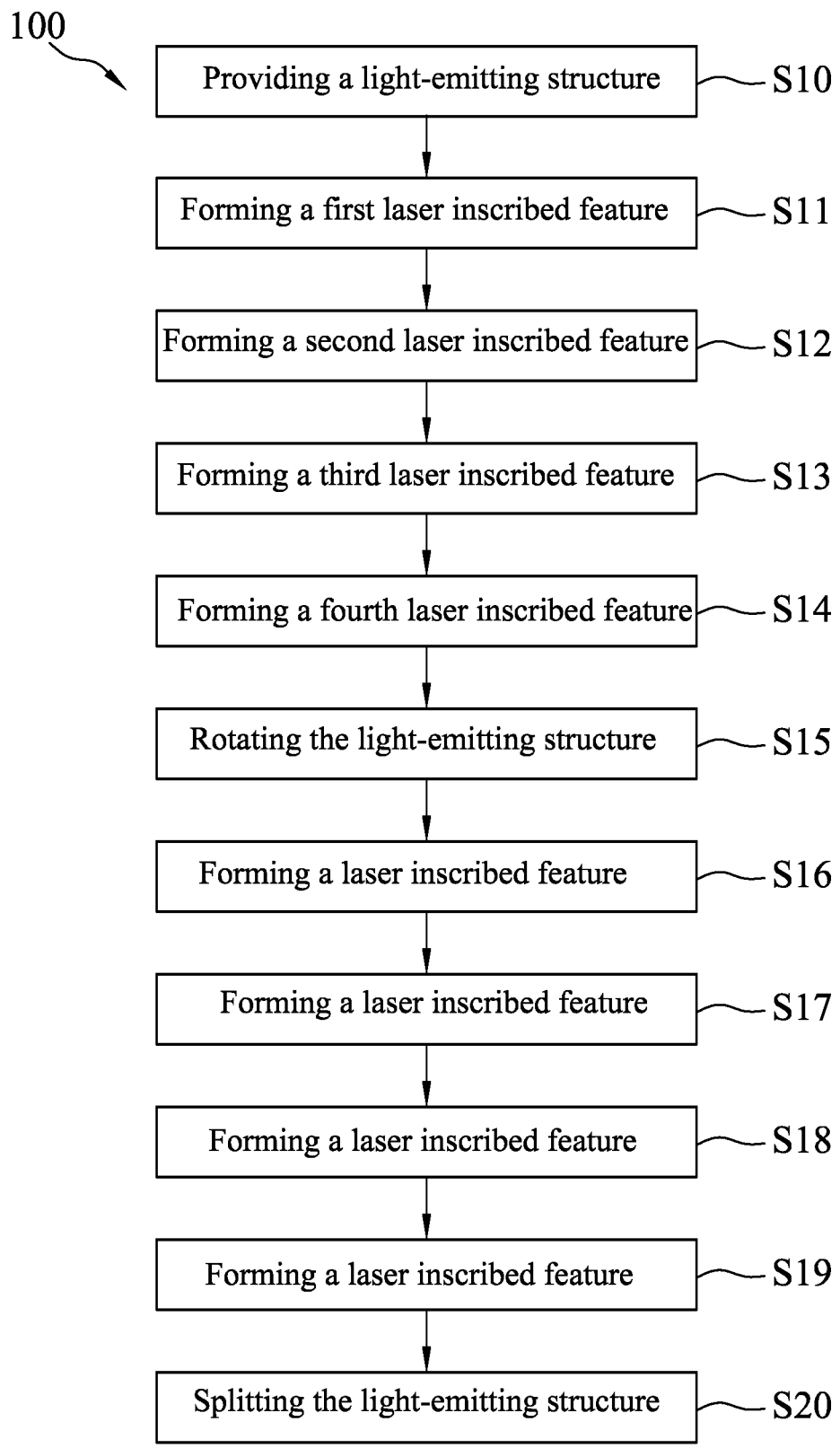
FIG. 4 is a flow chart illustrating consecutive steps of an embodiment of a method for manufacturing the first embodiment of the light-emitting diode chip according to the disclosure.
Figure 5:
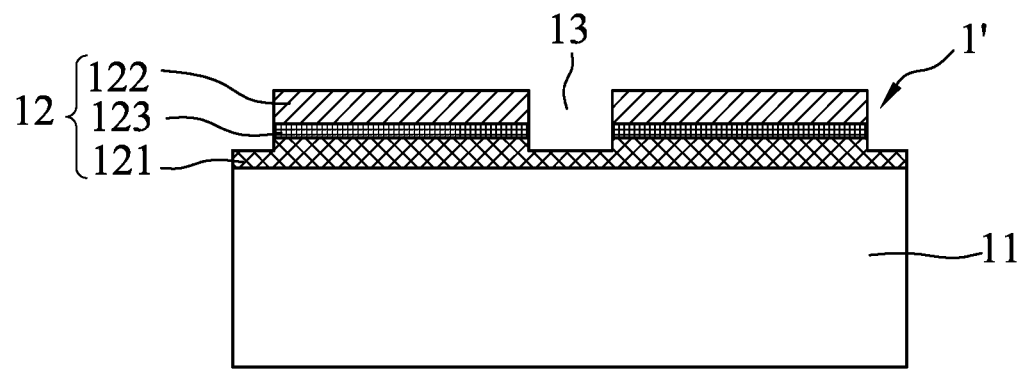
FIGS. 5 and 6 are respectively schematic side and top views illustrating step S10 of the embodiment of the method for manufacturing the first embodiment of the light-emitting diode chip.
Figure 6:
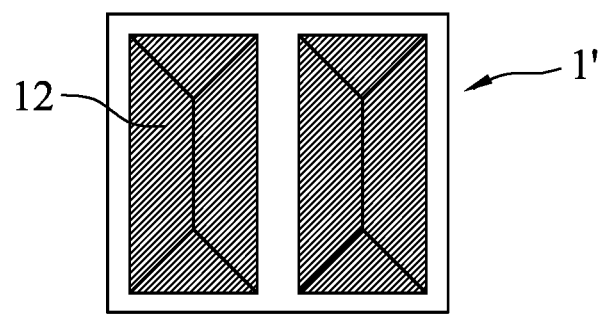

In step S10, as shown in FIGS. 4, 5 and 6, a light-emitting structure 1' is provided according to a light-emitting diode fabrication process, which may include forming the semiconductor light-emitting stack 12 with at least one dicing street 13 on the c-plane (not shown) of the substrate 11 made of sapphire, followed by polishing the light-emitting structure 1' until predetermined thickness thereof is obtained. In this embodiment, the light-emitting structure 1' may have a thickness of 200 µm.

Figure 7A:
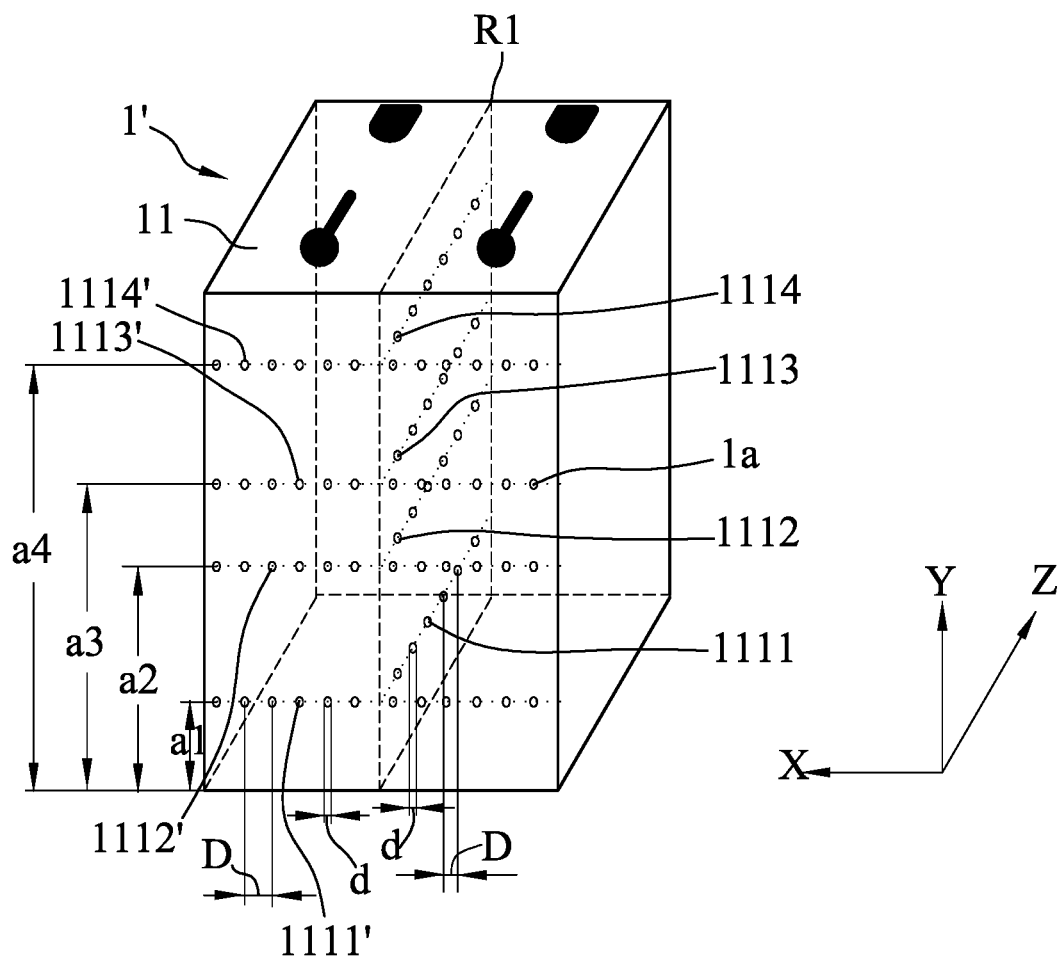
FIG. 7a is a schematic perspective view illustrating steps S11 to S19 of the embodiment of the method for manufacturing the first embodiment of the light-emitting diode chip.

In step S11, as shown in FIGS. 4 and 7a, a first laser inscribed feature 1111 is formed. Step S11 may include (i) mounting the substrate 11 on a carrier (not shown), (ii) moving a laser focal point along a Y direction to a first position that is located above a bottom surface of the substrate 11 by a first distance (a1), and then (iii) focusing and emitting a laser beam, so as to form a plurality of laser inscribed holes 1a, which cooperate with each other to constitute the first laser inscribed feature 1111. The laser inscribed holes 1a are spaced from each other in a Z direction transverse to the thickness direction (i.e., the Y direction) of the substrate 11. In this step, when the laser inscribed holes 1a are formed, cracks may be simultaneously formed, and may spread from the laser inscribed holes towards an upper surface of the substrate 11 or the bottom surface of the substrate 11. Such cracks may connect two adjacent ones of the laser inscribed holes 1a. In some embodiments, adjacent two of the laser inscribed holes 1a may spaced apart from each other by a distance (D) ranging from 3 µm to 20 µm. In some embodiments, each of the laser inscribed holes 1a may have a diameter (d) ranging from 1 µm to 4 µm. The laser inscribed holes 1a may have different sizes. In some embodiments, the laser inscribed holes 1a of one of the laser inscribed features 1111, 1112, 1113, 1114 proximate to the semiconductor light-emitting stack 12 may have sizes smaller than those of the laser inscribed holes 1a of one of the laser inscribed features 1111, 1112, 1113, 1114 distal from the semiconductor light-emitting stack 12. In some embodiments, adjacent two of the laser inscribed holes 1a of one of the laser inscribed features 1111, 1112, 1113, 1114 proximate to the semiconductor light-emitting stack 12 may be spaced apart from each other by a distance larger than that between adjacent two of the laser inscribed holes 1a of one of the laser inscribed features 1111, 1112, 1113, 1114 distal from the semiconductor light-emitting stack 12. In some embodiments, the first distance (a1) may range from 10 μm to 30 μm. In this step, the stealth dicing for forming the first laser inscribed feature 1111 may be performed on a back surface of the substrate 11. In some embodiments, the stealth dicing may be performed with a laser energy ranging from 0.01 W to 0.5 W. In some embodiments, the stealth dicing may be performed with a laser frequency ranging from 1 KHz to 100 KHz. In some embodiments, the carrier may be moved at a speed ranging from 1 mm/s to 800 mm/s.

In step S12, as shown in FIGS. 4 and 7a, a second laser inscribed feature 1112 is formed. Step S12 may include moving the laser focal point along the Y direction to a second position that is located above the bottom surface of the substrate 11 by a second distance (a2), followed by focusing and emitting a laser beam to perform the stealth dicing, so as to obtain the second laser inscribed feature 1112, which is constituted by a plurality of the laser inscribed holes 1a. The second distance (a2) may range from 40 μm to 60 μm. In step S12, the stealth dicing may be performed with the abovementioned laser energy and laser frequency. The carrier may be moved at a speed described above.

In step S13, as shown in FIGS. 4 and 7a, a third inscribed feature 1113 is formed. Step S13 includes moving the laser focal point along the Y direction to a third position that is located above the bottom surface of the substrate 11 by a third distance (a3), followed by focusing and emitting a laser beam to perform the stealth dicing, so as to obtain the third laser inscribed feature 1113, which is constituted by a plurality of the laser inscribed holes 1a. The third distance (a3) may range from 70 μm to 110 μm. In step S13, the stealth dicing may be performed with the abovementioned laser energy and laser frequency. The carrier may be moved at a speed described above.

In step S14, as shown in FIGS. 4 and 7a, a fourth laser inscribed feature 1114 is formed. Step S14 may include moving the laser focal point along the Y direction to a fourth position that is located above the bottom surface of the substrate 11 by a fourth distance (a4), followed by focusing and emitting a laser beam to perform the stealth dicing, so as to obtain the fourth laser inscribed feature 1114, which is constituted by a plurality of the laser inscribed holes 1a. The fourth distance (a4) may range from 120 μm to 160 μm. In step S14, the stealth dicing may be performed with the abovementioned laser energy and laser frequency. The carrier may be moved at a speed described above.

In this embodiment, the substrate 11 defines a reference plane R1 in the thickness direction (i.e., the Y direction), and the laser inscribed features 1111, 1112, 1113, 1114 thus formed are located in the reference plane R1, as shown in FIG. 7a.

Figure 7B:
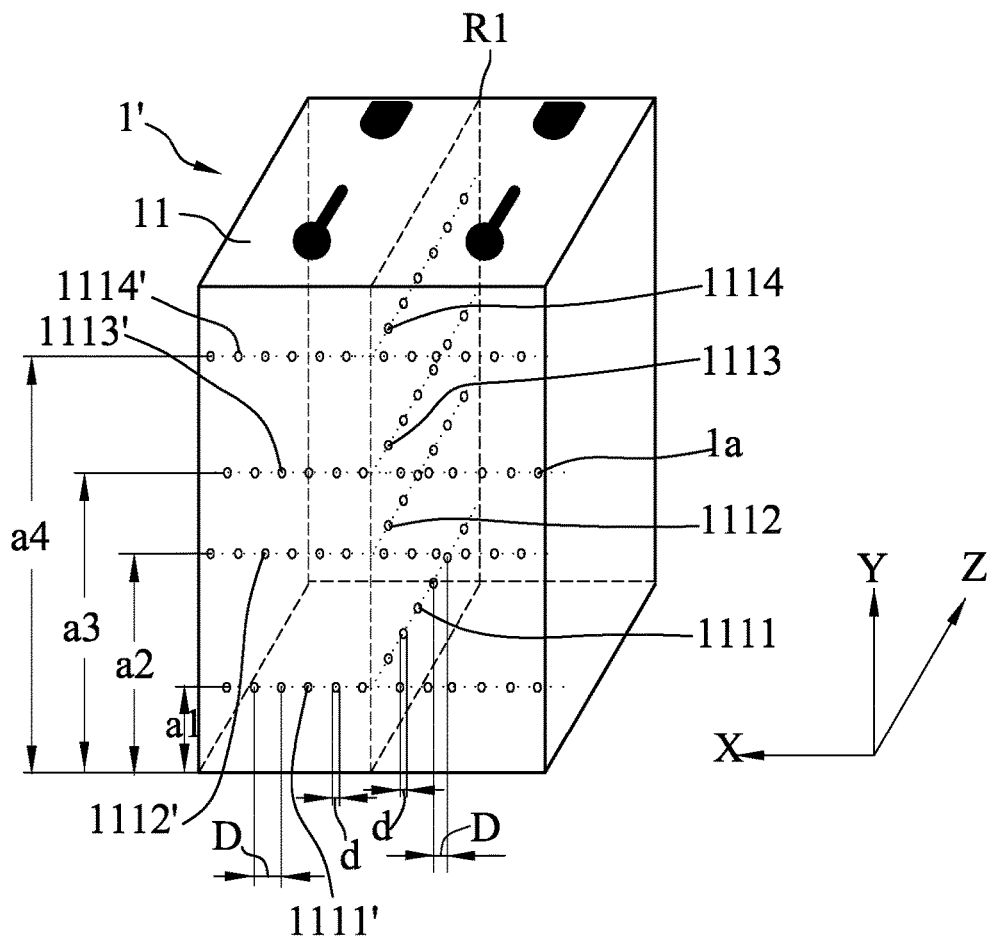

In step S15, as shown in FIG. 4, the light-emitting structure 1' is rotated 90 degrees. Afterwards, steps S16 to S19 are performed to form four laser inscribed features 1111', 1112', 1113', 1114'. Steps S16 to S19 are similar to steps S11 to S14, and therefore, the details thereof are omitted for the sake of brevity. In this embodiment, the laser inscribed holes 1a of each of the laser inscribed features 1111', 1112', 1113', 1114' are in alignment with the laser inscribed holes 1a of adjacent one of the laser inscribed features 1111', 1112', 1113', 1114', respectively, as shown in FIG. 7a. In a variation of this embodiment, the laser inscribed holes 1a of each of the laser inscribed features 1111', 1112', 1113', 1114' are staggered with the laser inscribed holes 1a of adjacent one of the laser inscribed features 1111', 1112', 1113', 1114', as shown in FIG. 7b. In such case, the cracks may be spread more easily from the laser inscribed holes 1a, such that the substrate 11 can be split along the laser inscribed holes 1a and the cracks, which is conducive for reducing the oblique fracture.

In step 20, as shown in FIGS. 4 and 8, the light-emitting structure 1' is split, so as to obtain a plurality of the light-emitting diode chips 1. Step 20 may include attaching an adhesive film as a protective film to the back surface of the light-emitting structure 1', followed by splitting the light-emitting structure 1' using a splitting machine (not shown), so as to obtain the light-emitting diode chips 1. The light-emitting structure 1' may be split from a front surface or the back surface of the light-emitting structure 1' using the splitting machine.

In this embodiment, the laser inscribed features 1111, 1112, 1113, 1114 are formed by stealth dicing in a portion of the substrate 11 of the light-emitting structure 1' corresponding to the dicing street 13 of the light-emitting structure 1'. The laser inscribed features 1111, 1112, 1113, 1114 are spaced apart from each other in the thickness direction (i.e., the Y direction) of the substrate 11. The stealth dicing is performed using single-beam laser.

The distance (D) between adjacent two of the laser inscribed holes 1a of each of the laser inscribed features 1111, 1112, 1113, 1114 may be the same in some embodiments, and may be different in some alternative embodiments. In some embodiments, the laser inscribed holes 1a of each of the laser inscribed features 1111, 1112, 1113, 1114 may be respectively aligned with those of the others of the laser inscribed features 1111, 1112, 1113, 1114. In some alternative embodiments, the laser inscribed holes 1a of each of the laser inscribed features 1111, 1112, 1113, 1114 may be staggered with those of an adjacent one of the laser inscribed features 1112, 1112, 1113, 1114.

Referring to FIGS. 9 and 10, the principle of formation of a serrated side surface of a substrate is described as follows. It is noted that the direction of a-axis of the substrate shown in FIG. 9 corresponds to the direction of a-axis of a unit cell shown in FIG. 10, and that the direction of a laser inscribed feature is parallel to r-plane of the unit cell. Specifically, when the stealth dicing is performed on a sapphire substrate of a light-emitting structure, a laser inscribed feature may be formed on the r-plane of the unit cell of the substrate, such that a fracture may be formed along the r-plane due to stress, and may only be formed nearby a position of a laser focal point without penetrating the light-emitting structure. Afterwards, the light-emitting structure is split, so as to obtain individual light-emitting diode chips with the serrated side surface, which is similar to the light-emitting diode chips as shown in FIGS. 2 and 3.

Referring to FIGS. 11 and 12, an embodiment of a method for manufacturing the second embodiment of the light-emitting diode chip 1A according to the disclosure is generally similar to the method 100 for manufacturing the first embodiment of the light-emitting diode chip 1 except for steps S11 to S14 and S16 to S19.

In step S11, as shown in FIG. 11, after moving the laser focal point to the first position, the laser focal point rightward is moved in a X direction by a predetermined distance ($\Delta X$), followed by focusing and emitting a laser beam, so as to form a plurality of the laser inscribed holes 1a, which cooperate with each other to constitute a first laser inscribed feature 2111. The predetermined distance ($\Delta X$) may range from 5 μm to 50 μm.

In step S12, as shown in FIG. 11, after moving the laser focal point to the second position, the laser focal point is moved leftward in the X direction by the predetermined distance ($\Delta X$), followed by focusing and emitting a laser beam, so as to form a plurality of the laser inscribed holes 1a, which cooperate with each other to constitute a second laser inscribed feature 2112.

In step S13, as shown in FIG. 11, after moving the laser focal point to the third position, the laser focal point rightward is moved in the X direction by the predetermined distance ($\Delta X$) followed by focusing and emitting the laser beam, so as to form a plurality of the laser inscribed holes 1a, which cooperate with each other to constitute a third laser inscribed feature 2113.

In step S14, as shown in FIG. 11, after moving the laser focal point to the fourth position, the laser focal point is moved leftward in the X direction by the predetermined distance ($\Delta X$), followed by focusing and emitting the laser beam, so as to form a plurality of the laser inscribed holes 1a, which cooperate with each other to constitute a fourth laser inscribed feature 2114. In this embodiment, the substrate 11A defines two reference planes R1, R2 and a central reference plane Rc in the thickness direction (i.e., the Y direction). The two reference planes R1, R2 are parallel to each other, and are opposite to each other relative to the central reference plane Rc. Each of the two reference planes R1, R2 is spaced apart from the central reference plan Rc by the predetermined distance ($\Delta X$). The laser inscribed features 2111, 2113 are categorized into a first group of the laser inscribed features 2111, 2112, 2113, 2114, and the laser inscribed features 2112, 2114 are categorized into a second group of the laser inscribed features 2111, 2112, 2113, 2114. The first group and the second group are located in the two reference planes R1, R2, respectively. The laser inscribed features 2111, 2113 in the first group are staggered with the laser inscribed features 2112, 2114 in the second group.

It is noted that a ratio of an absolute value of a difference between the predetermined distance ($\Delta X$) moving rightward in the X direction and the predetermined distance ($\Delta X$) moving leftward in the X direction to a larger one of the predetermined distances ($\Delta X$) may range from 10% to 30%.

Referring to FIG. 13, in a variant of the embodiment of the method 100 for manufacturing the first embodiment of the light-emitting diode chip 1 according to the disclosure, the stealth dicing is performed using a multi-beam laser. The multi-beam laser may be generated from a plurality of laser heads through an optical converter 4. In this variant, the stealth dicing is performed using a multi-beam laser which includes four laser beams generated from four laser heads 31, 32, 33, 34, respectively. The four laser beams respectively generated from the four laser heads 31, 32, 33, 34 form the first, second, third, and fourth laser inscribed features 1111, 1112, 1113, 1114 simultaneously, thereby increasing production yield of the light-emitting diode chip 1. It is noted that the number of the laser heads may vary depending on the number of the laser inscribed features to be formed.

The laser inscribed features 2111, 2112, 2113, 2114 in the second embodiment of the light-emitting diode chip 1A according to the disclosure can also be formed by stealth dicing using the multi-beam laser which includes the four laser beams generated from the four laser heads 31, 32, 33, 34, respectively.

Referring to FIG. 14, in another variant of the embodiment of the method 100 for manufacturing the first embodiment of the light-emitting diode chip 1 according to the disclosure, the stealth dicing is performed using a multi-beam laser which includes multiple laser beams converted from the single-beam laser through an optical converter 4'. In this variant, the single-beam laser is converted into a four-beam laser including four laser beams for forming the first, second, third, and fourth laser inscribed features 1111, 1112, 1113, 1114, simultaneously, which is conducive for increasing production yield of the light-emitting diode chip and reducing manufacturing cost thereof. The optical converter 4' may include, but not Limited to, a concave lens, a convex lens, a curved mirror, an optical crystal, or combinations thereof. It is noted that the number of the laser beams converted by the optical converter 4 may vary depending on the number of the laser inscribed features to be formed.

The laser inscribed features 2111, 2112, 2113, 2114 in the second embodiment of the light-emitting diode chip 1A according to the disclosure can also be formed by stealth dicing using the optical converter 4' to convert the single-beam laser into the four-beam laser.

In the present disclosure, a plurality of the laser inscribed features are formed by stealth dicing in a portion of the substrate of the light-emitting structure, followed by splitting the light-emitting structure along the laser inscribed features along the laser inscribed holes and the cracks, so as to obtain individual light-emitting diode chips. In addition, side surfaces of each of the light-emitting diode chips are roughened and configured as the serrated surfaces by forming the plurality of the laser inscribed features, an amount of light emitted from the side surfaces can be increased and the luminous efficiency of the light-emitting diode chips can be enhanced. Moreover, because of the serrated side surfaces of the light-emitting diode chip and a difference between a refractive index of the substrate of light-emitting diode chip and a refractive index of air, a light-emitting angle of lights emitted from the light-emitting layer of the light-emitting diode chip may be increased and a traveling direction of lights emitted therefrom may be directed to an axial direction when passing through the serrated side surface of the light-emitting diode chip. A thick wafer for LED may also be completely cut by such stealth dicing technique to form the plurality of the laser inscribed features, which can effectively improve yield rate of the light-emitting diode chips split from the light-emitting structure and reduce oblique fractures of the substrate, and can further reduce a width of the dicing street and increase production yield of the light-emitting diode chips processed from a single wafer. In addition, the stealth dicing can be performed at a lower laser energy to form the laser inscribed features in a portion of the substrate of the light-emitting structure, thereby reducing electrical failure rate of the light-emitting diode chips.

In the description above, for the purposes of explanation, numerous specific details have been set forth in order to provide a thorough understanding of the embodiments. It will be apparent, however, to one skilled in the art, that one or more other embodiments may be practiced without some or these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode chip, comprising:
a substrate which is made of sapphire, and which has a side surface configured as a serrated surface, said serrated surface comprising a plurality of laser inscribed features disposed along a thickness direction of said substrate and spaced apart from each other, wherein said laser inscribed features are formed on a r-plane of a unit cell of said substrate.

2. The light-emitting diode chip of claim 1, wherein said substrate defines a reference plane in the thickness direction, and said laser inscribed features are located in the reference plane.

3. The light-emitting diode chip of claim 1, wherein said substrate defines a plurality of reference planes in the thickness direction and parallel to each other, and said laser inscribed features are located in the reference planes.

4. The light-emitting diode chip of claim 1, wherein said substrate defines two reference planes in the thickness direction and parallel to each other, said laser inscribed features are categorized into a first group of said laser inscribed features and a second group of said laser inscribed features, which are located in the two reference planes, respectively, said laser inscribed features in the first group being staggered with said laser inscribed features in the second group.

5. The light-emitting diode chip of claim 1, further comprising a semiconductor light-emitting stack disposed on said substrate, a distance between one of said laser inscribed features and said semiconductor light-emitting stack ranging from two-third to one-fifth of a thickness of said light-emitting diode chip.

* * * * *